(12) United States Patent
Mitchell et al.

(10) Patent No.: US 6,525,327 B1
(45) Date of Patent: Feb. 25, 2003

(54) ION IMPLANTER AND BEAM STOP THEREFOR

(75) Inventors: Robert John Clifford Mitchell, Pulborough (GB); Michael T. Wauk, West Sussex (GB); John Ruffell, Sunnyvale, CA (US); Hilton Glavish, Incline Village, NV (US); Peter Kindersley, Horsham (GB)

(73) Assignee: Applied Materials, Inc., Santa Clara, CA (US)

( * ) Notice: Subject to any disclaimer, the term of this patent is extended or adjusted under 35 U.S.C. 154(b) by 81 days.

(21) Appl. No.: 09/686,803

(22) Filed: Oct. 12, 2000

(30) Foreign Application Priority Data

Oct. 12, 1999 (GB) .............................................. 9924179

(51) Int. Cl.[7] .............................................. H01J 37/304
(52) U.S. Cl. .............................. 250/492.21; 250/492.2; 250/397; 250/398
(58) Field of Search ........................... 250/492.21, 397, 250/492.2, 398

(56) References Cited

U.S. PATENT DOCUMENTS 4,361,762 A * 11/1982 Douglas ..................... 250/251
4,717,829 A  1/1988 Turner
4,980,562 A * 12/1990 Berrian et al. ........... 250/492.2

FOREIGN PATENT DOCUMENTS

| EP | 457311 A2 | 5/1991 | |
| EP | 0534737 A1 * | 9/1992 | .......... H01J/37/244 |
| EP | 0975004 A2 | 7/1999 | |
| JP | 10177074 | 6/1998 | |
| JP | 10255713 | 9/1998 | |
| WO | WO8804103 | 6/1988 | |
| WO | WO9913488 | 3/1999 | |

* cited by examiner

*Primary Examiner*—Bruce Anderson
*Assistant Examiner*—Zia R. Hashmi
(74) *Attorney, Agent, or Firm*—Boult Wade Tennant

(57) ABSTRACT

A beam stop (23) has a charge collecting member (40) which extends in the direction of scanning of a scanned beam by less than the total distance scanned, so that variation in the charge signal derived from the collecting member can provide a timing signal for use in monitoring alignment of the scanned beam. In a preferred embodiment, the beam stop plate (42) has slits (65–69) leading to apertures (60–64) containing charge collecting rods (73–75) located within the thickness of the beam stop plate (42).

27 Claims, 5 Drawing Sheets

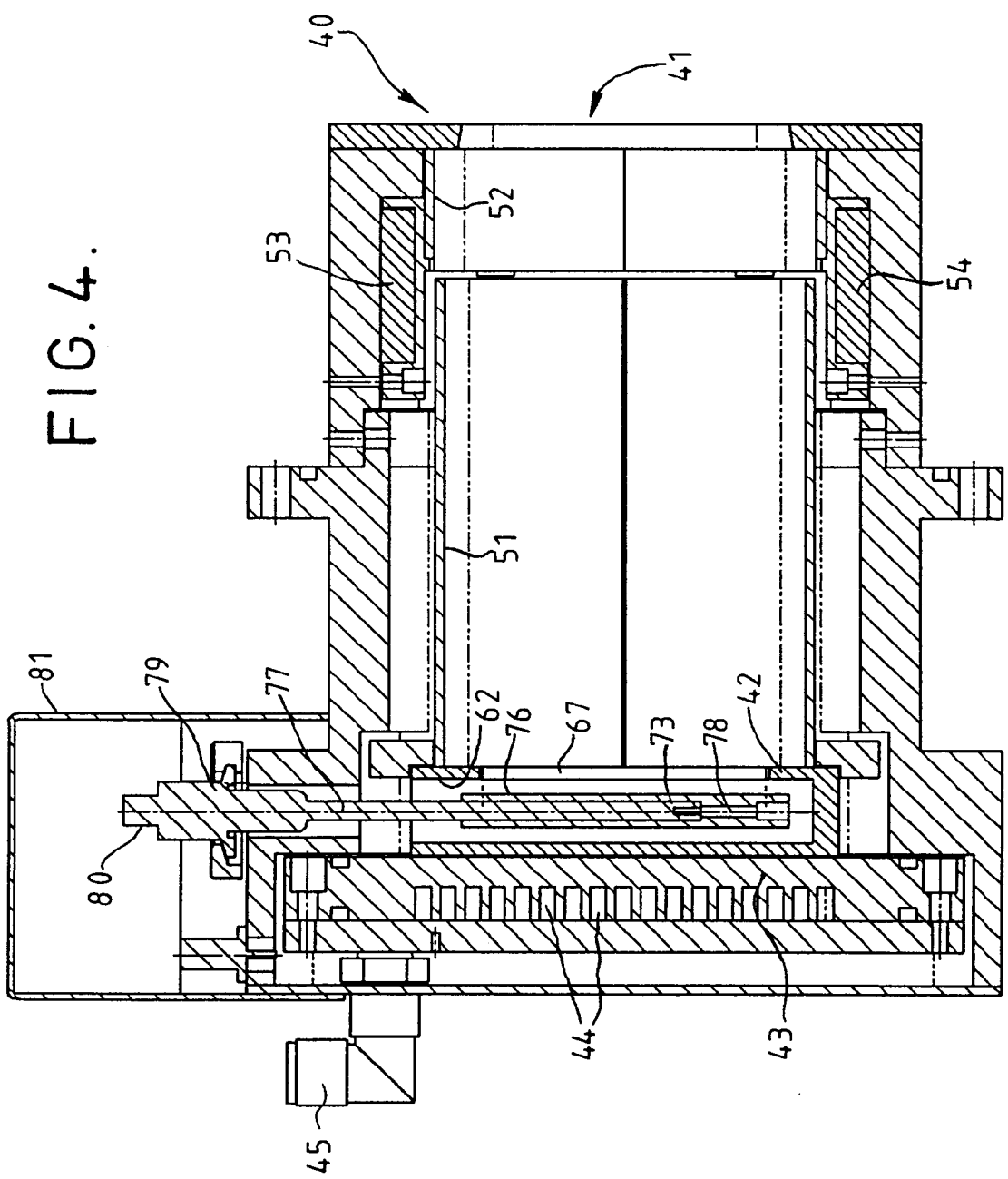

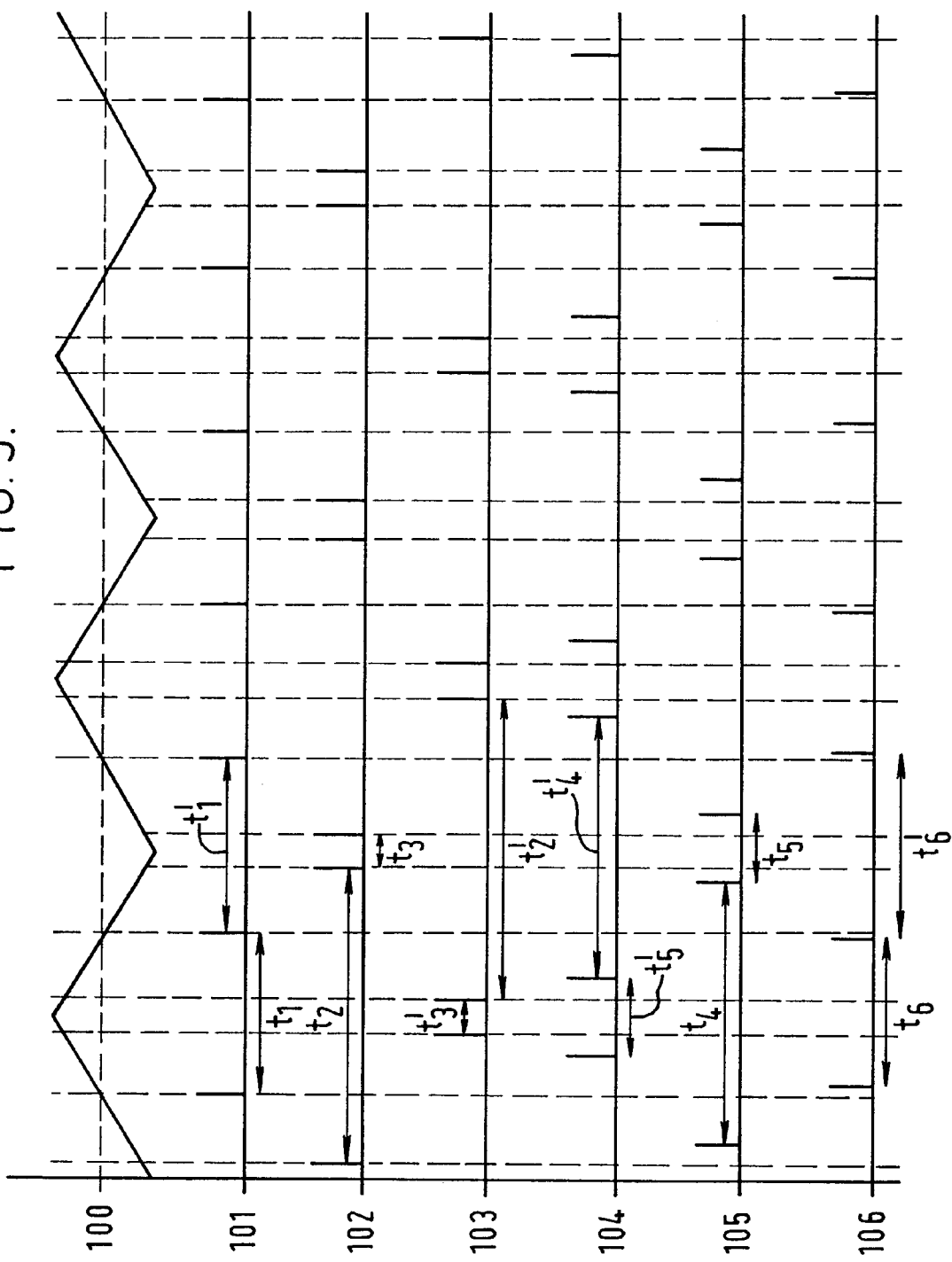

ION IMPLANTER AND BEAM STOP THEREFOR

FIELD OF THE INVENTION

The invention is concerned with ion implanters and with a beam stop used in an ion implanter.

BACKGROUND OF THE INVENTION

Ion implanters have been used for many years in the processing of semiconductor wafers. Typically, a beam of ions of a required species is produced and directed at a wafer or other semiconductor substrate, so that ions become implanted under the surface of the wafer. Implantation is typically used for producing regions in the semiconductor wafer of altered conductivity state, by implanting in the wafer ions of required dopant.

Known ion implanters include batch type implanters such as described in U.S. Pat. No. 4,733,091 (assigned to Applied Materials, Inc.), and single wafer-type implanters, such as described in U.S. Pat. No. 5,229,615 (assigned to Eaton Corporation). In typical batch type implanters, wafers being implanted are mechanically scanned in each of two substantially orthogonal directions, repeatedly through a fixed ion beam, to ensure an even implantation dose over the entire wafer surface. In typical single wafer-type implanters, the ion beam itself is scanned transversely in one orthogonal direction at a relatively high scanning rate, and the single wafer being implanted is mechanically translated to and fro across the scanned beam substantially in a second orthogonal direction.

In single wafer-type implanters, the ion beam can be scanned electrostatically or electromagnetically and it is normal practice to collimate the scanned beam so that the beam impinging on the wafer remains parallel to a desired beam direction during scanning.

SUMMARY OF THE INVENTION

An object of the present invention is to provide an implanter with provision for setting up the correct alignment and positioning of the scanned beam relative to the wafer to be implanted. A further object of embodiments of the invention is the provision of a beam stop for use in a scanned beam implanter.

Accordingly, in one aspect the invention provides a beam stop for an ion implanter in which the ion beam is scanned in at least one direction transverse to the beam path, the beam stop having a dimension extending in said one direction to receive the beam over its scan in said one direction, and comprising at least one charge collecting member providing a surface exposed to receive ions in said beam, said exposed surface extending in said one direction a distance less than said dimension so that said charge collecting member receives beam ions during only a part of the scan of the beam in said one direction.

With this arrangement, a separate electrical connection can be made to the charge collecting member and the current received by the charge collecting member from the beam as it scans to and fro can be monitored. Because the charge collecting member receives beam ions during only a part of the scan of the beam, the current signals from the charge collecting member has a characteristic shape which is repeated in synchronism with the scanning of the ion beam. By comparing the timing of features of this characteristic shape of the current signal, with the timing of the scanning of the ion beam, the position of the scanned beam relative to the beam stop itself can be monitored.

Preferably, the beam stop includes a beam stop plate extending in said one direction to receive the beam over the scan of the beam in said one direction, said charge collecting member being electrically insulated from the beam stop plate. Then, the beam stop plate may have a surface receiving the beam and the charge collecting member may be mounted behind the surface, the surface having an aperture in front of the charge collecting member to permit beam ions to pass through the surface to impinge on the collecting member. In this way, the exposed surface of the collecting member can be made relatively small in the scanning direction of the beam, with the result that the current signal from the charge collecting member exhibits a characteristic pulse shape as the beam scans over the aperture in the surface of the beam stop plate. The timing of this pulse relative to the beam scanning can then be used for monitoring the location of the scanned beam relative to the beam stop.

The beam stop plate should normally be thick enough to absorb the power of the ion beam impinging on it. The plate will normally be water cooled. Typically the beam stop plate is thicker in the beam direction than the collecting member and then has a cavity behind the aperture in the facing surface of the beam stop plate, with the collecting member being mounted in this cavity.

The charge collecting member may be a rod and said aperture in the facing surface of the beam stop plate may be a slit, both the rod and slit then extending transversely of the beam scanning direction.

In one embodiment, the beam stop comprises a single charge suppressed Faraday cup having an opening extending in said one direction to receive the beam over its scan in said one direction, said charge collecting member being located in said Faraday cup. Then the beam stop plate is also located in the Faraday cup and is usually insulated from the Faraday cup, to allow a current signal to be derived from the plate for monitoring the total beam current absorbed in the beam stop.

In respective preferred embodiments, the beam stop, the beam stop plate or the Faraday cup opening may extend over the entire scan of the beam.

In a preferred arrangement, a plurality of said charge collecting members electrically insulated from each other are provided at different locations along the scanning direction. Individual characteristic current signals can then be derived from each of the charge collecting members for use, for example with a travelling Faraday or other beam detector as will be described later herein, for monitoring that the scanned beam is correctly centered on the beam stop, is aligned with a required beam direction and remains parallel during scanning.

Conveniently three said charge collecting members are distributed symmetrically in the beam scanning direction.

The invention also provides an ion implanter comprising an ion beam generator, a scanner for scanning the ion beam in at least one direction transverse to the beam path, a process chamber receiving the scanned beam and having a process station in the path of the scanned beam at which a substrate can be processed, and a beam end station behind said processing station for terminating the scanned beam and defining a nominal center line for the scanned beam, said beam end station including at least one fixed beam detector providing a characteristic signal as the beam is scanned over the detector. Preferably the implanter further includes a centering monitor responsive to the timing of said characteristic signals from said at least one beam detector to provide a centering signal indicative of the centering of said beam relative to said nominal centre line.

Preferably, the or each fixed beam detector is constituted by a respective charge collecting member in a beam stop of the kind described above.

A plurality of said fixed beam detectors may be distributed symmetrically about said nominal center line along said one direction. Preferably, said scanner is operative to scan the ion beam in accordance with a symmetrical triangular waveform, successive characteristic signals from each of any pair of symmetrically opposed said fixed beam detectors having respective first and second alternating uniform time spacings, and said centering monitor providing said centering signals as a function of any difference between said first and second time spacings for one of said pair of detectors and said first and second time spacings for the other of said pair.

In another arrangement there may be one fixed beam detector located on said nominal center line. Then, again where said scanner provides a symmetrical triangular scan waveform, said centering monitor provides said centering signal as a function of any non-uniformity in the time spacing of the successive characteristic signals from said central fixed beam detector.

In an alternative arrangement, one fixed beam detector may be located at a known distance from said center line and then said centering monitor may be operative to compare the timing of characteristic signals from said beam detector with the waveform of said scan signal.

Preferably, the scanner is operative to deflect the beam in accordance with a periodic scan signal including an adjustable dc component for centering the scanned beam, and the implanter further includes a controller responsive to said centering signal to adjust said dc component to center said beam.

In another embodiment, the implanter further comprises a collimator in combination with said scanner for maintaining the scanned beam path parallel, a travelling beam detector located upstream of said beam end station and movable in said one direction, said travelling beam detector providing a second characteristic signal as the beam is scanned over said travelling detector, and an alignment monitor responsive to a function of the timings of said first-mentioned and said second characteristic signals to provide a beam alignment signal.

Preferably, said scanner and collimator combination is operative to deflect the beam in accordance with a periodic scan signal and is adjustable to adjust the path direction of the parallel scanned beam, and the implanter further includes a controller responsive to said alignment signal for controlling the scanner and collimator combination to adjust said path direction towards a required beam path direction.

Preferably, said travelling beam detector has an actuator responsive to said controller to move said detector to desired positions in said one direction, and said controller is operative to measure the timing of said first characteristic signal with respect to said scan waveform when the travelling beam detector is positioned by said actuator so as not to screen said fixed beam detector, and to measure the timing of said second characteristic signal with respect to said scan waveform when the travelling beam detector is positioned by the actuator at a predetermined location along said one direction, said predetermined location corresponding to the location of said fixed detector along said one direction, said controller being responsive to said measured timings to adjust said path direction so that corresponding said measured timings are substantially the same.

In a further aspect, the present invention provides an ion implanter comprising an ion beam generator, a scanner and collimator for scanning the ion beam in at least one direction transverse to the beam path and for maintaining the scanned beam path parallel, a process chamber receiving the parallel scanned beam and having a process station in the path of the scanned beam at which a substrate can be processed, a beam end station behind said processing station for terminating the scanned beam, said beam end station including at least two fixed beam detectors at respective spaced positions along said one direction, each said beam detector providing a respective first characteristic signal as the beam is scanned over the fixed detector, a travelling beam detector located upstream of said beam end station and movable in said one direction, said travelling beam detector providing a second characteristic signal as the beam is scanned over said travelling detector, and a parallelism monitor responsive to a function of at least the timings, of said first characteristic signals and of said second characteristic signals at at least two spaced positions of the travelling beam detector along said one direction, to provide a collimation signal indicative of the parallelism of said scanned beam.

Preferably then, said travelling beam detector has an actuator responsive to said controller to move said detector to desired position in said one direction, and said controller is operative to measure the timings of said first characteristic signals when the travelling beam detector is positioned by said actuator so as not to screen the respective fixed beam detectors, and to measure the timings of said second characteristic signals when the travelling beam detector is positioned by the actuator at predetermined locations along said one direction corresponding respectively to the locations of said fixed detectors, said parallelism monitor being responsive to said measured timings to provide said collimation signal.

The substrate for processing is typically a semiconductor substrate, but flat panel and polymer substrates may also be used.

There follows by way of example only a description of preferred embodiments of the invention.

BRIEF DESCRIPTION OF THE DRAWINGS

FIG. 4 is an enlarged sectional view in elevation of the beam stop.

FIG. 5 is a timing diagram illustrating signal pulses derived from the beam stop and from the travelling Faraday and used for controlling beam alignment and parallelism.

DESCRIPTION OF THE PREFERRED EMBODIMENTS

Figure 1:
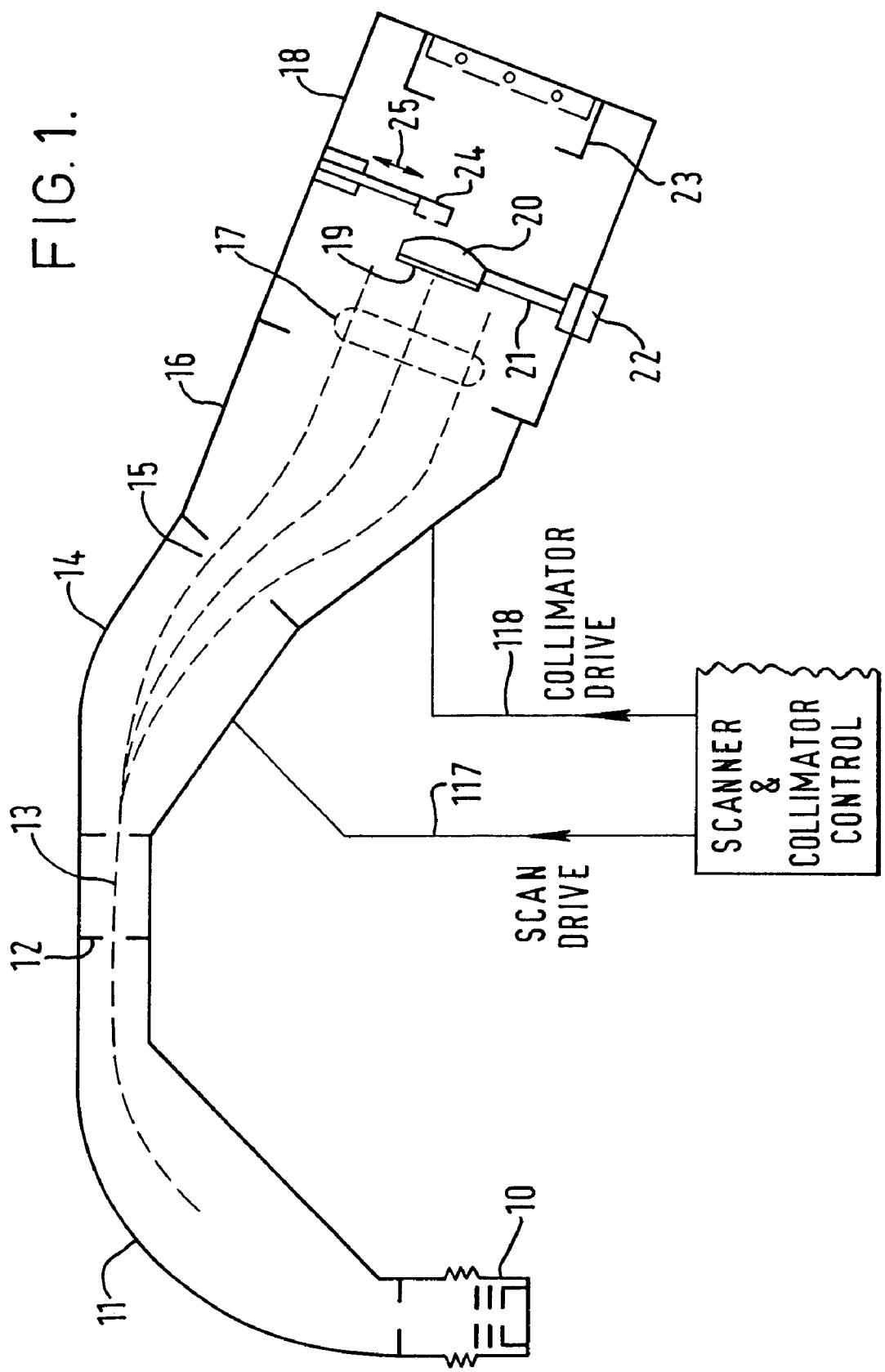
FIG. 1 is a schematic plan view of an ion implanter incorporating a beam stop embodying the present invention.

Referring to FIG. 1, the beam of ions for implantation is produced by an ion source 10. The ions from the ion source 10 pass through an analyser magnet 11 so that only ions of a desired mass/energy ratio pass through a mass selection slit 12 at the exit of the analyser magnet 11. A beam 13 of ions of the desired mass/energy then enter a beam scanner 14 in which the beam is deflected to and fro in the plane of the paper of FIG. 1, in a direction transverse to the beam path. The beam may be scanned by the scanner 14 at a relatively high repetition rate, typically between 100 and 200 Hz.

The scanned beam 15 emerging from the scanner 14 then enters a collimator 16. The collimator 16 is arranged to bend the scanned beam 15 by differing amounts depending on the scan position of the beam, so that the scanned beam 17 emerging from the collimator 16 remains substantially parallel to a desired beam path as the beam is scanned to and fro.

The parallel scanned beam 17 emerging from the collimator 16 enters a process chamber 18 in which the beam may impinge upon a wafer 19 mounted on a wafer holder 20. The scanner 14 and collimator 16 are designed so that the scanned beam 17 extends right across the width of the wafer 19 on the holder 20, effectively drawing a stripe across the wafer as the beam is scanned to and fro.

The wafer holder 20 is itself mounted on a reciprocating scanning arm 21 carried by an actuator 22 which causes the wafer holder 20 and the wafer 19 thereon to execute a reciprocating motion through the plane of the scanned beam 17, so that all parts of the wafer can be implanted with the ions of the beam. Normally, the reciprocating scanning motion of the wafer holder 20 is at a relatively lower repetition rate, typically of the order of 1 Hz.

The elements of the ion implanter described so far may be as constituted in known ion implanters, particularly, implanters for implanting single wafers one at a time and employing a hybrid scanning system in which the ion beam is scanned transversely in one direction, whilst the wafer is mechanically reciprocated in an orthogonal direction. An ion implanter of this kind is described for example in WO 99/13488. The ion source, mass analysis and scanning and collimating arrangements of the example of the present invention illustrated in FIG. 1 may be of kinds known to those skilled in this art. For example, the scanner 14 may use either electromagnetic or electrostatic scanning, and similarly the collimator 16 may employ magnetic or electrostatic fields.

Although the above mentioned prior art specification discloses a particular mechanical system for providing the reciprocation motion of the wafer holder 20 in the process chamber 18, any suitable mechanical arrangement may alternatively be employed.

In the process chamber 18, a beam stop 23 is located behind the wafer holder 20 to receive the scanned beam over its entire scan in the scanning plane. In addition, a travelling Faraday 24 is provided located just behind the wafer holder 20. The travelling Faraday is designed to provide a current pulse in response to the ion beam scanning over the Faraday. The Faraday 24 may be employed for obtaining measurements of the ion dose rate provided by the ion beam at various points over the scan of the ion beam. For this purpose the travelling Faraday 24 can be moved transversely of the direction of the ion beam, in the direction of the arrow 25 to different positions over the range of scan of the scanned beam. Extreme positions for the Faraday are shown in FIG. 2 at 34 and 35.

During implantation of a wafer 19 on the holder 20, the Faraday 24 may be located near one end of the range of scan of the ion beam, just clear of an edge of the wafer holder 20, so as to provide signals indicating the rate of dose delivery of the ion beam during implantation.

Insofar as its applications have been described above, the scanning Faraday 24 provides the same function as the Faraday disclosed in the ion implanter described in the above mentioned prior art specification WO 99/13488.

Figure 2:
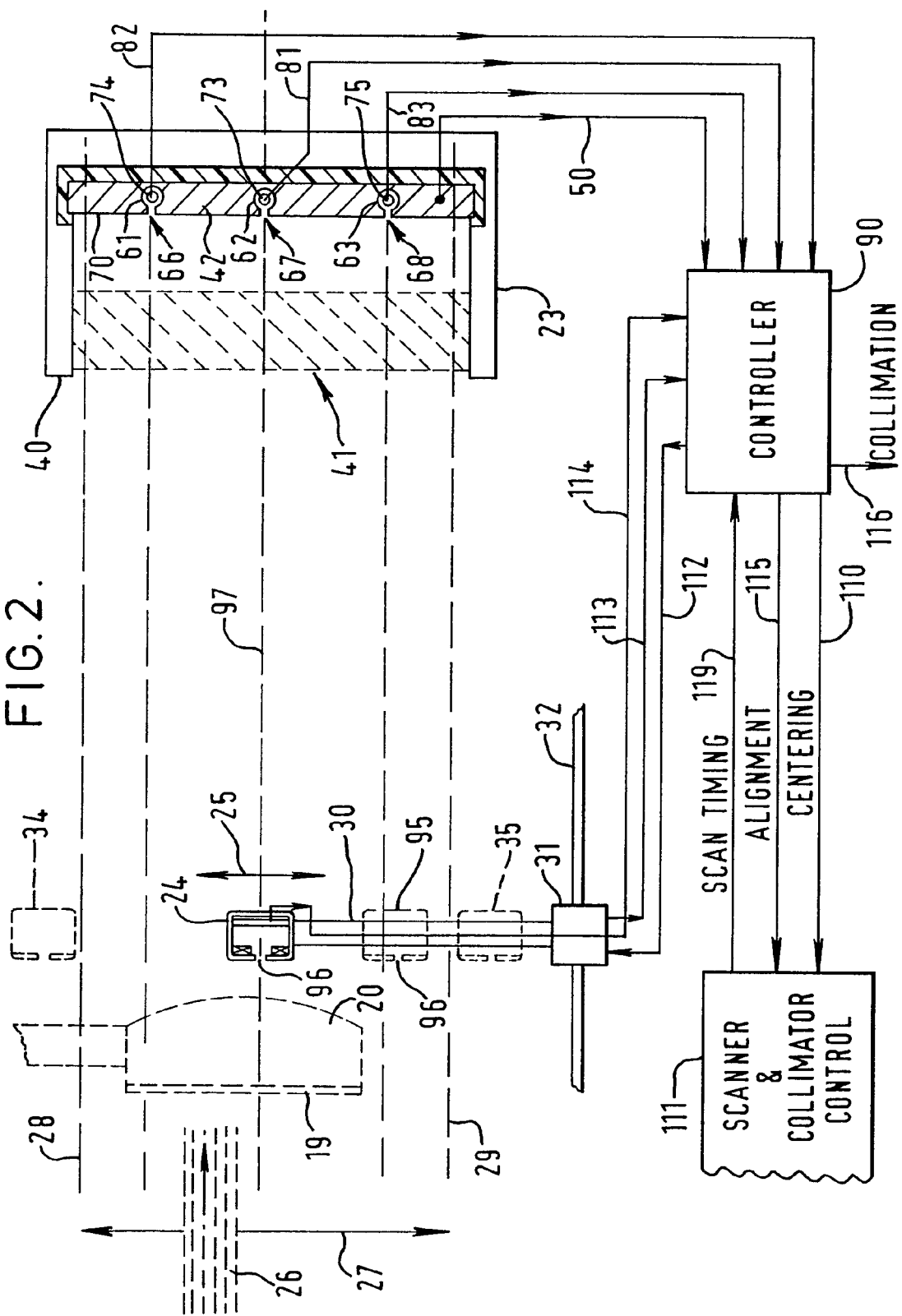
FIG. 2 is a schematic representation of the beam stop of FIG. 1 in the process chamber of the ion implanter and illustrating a system for controlling the ion beam scanner and collimator in accordance with embodiments of the invention.

Referring now to FIG. 2, the arrangement of the components in the process chamber 18 of FIG. 1 are illustrated in more detail. The ion beam entering the process chamber is illustrated in FIG. 2 at 26 and the parallel scanning of the ion beam 26 is illustrated by the arrows 27 so that the scanned region extends between the upper and lower limits 28 and 29 respectively.

The semiconductor wafer 19 on the wafer holder 20 are illustrated in FIG. 2 in dotted outline.

Travelling Faraday 24 is shown mounted on a shaft 30 extending from an actuator 31 which is in turn mounted on a vacuum enclosure wall 32 of the process chamber 18.

Figure 3:
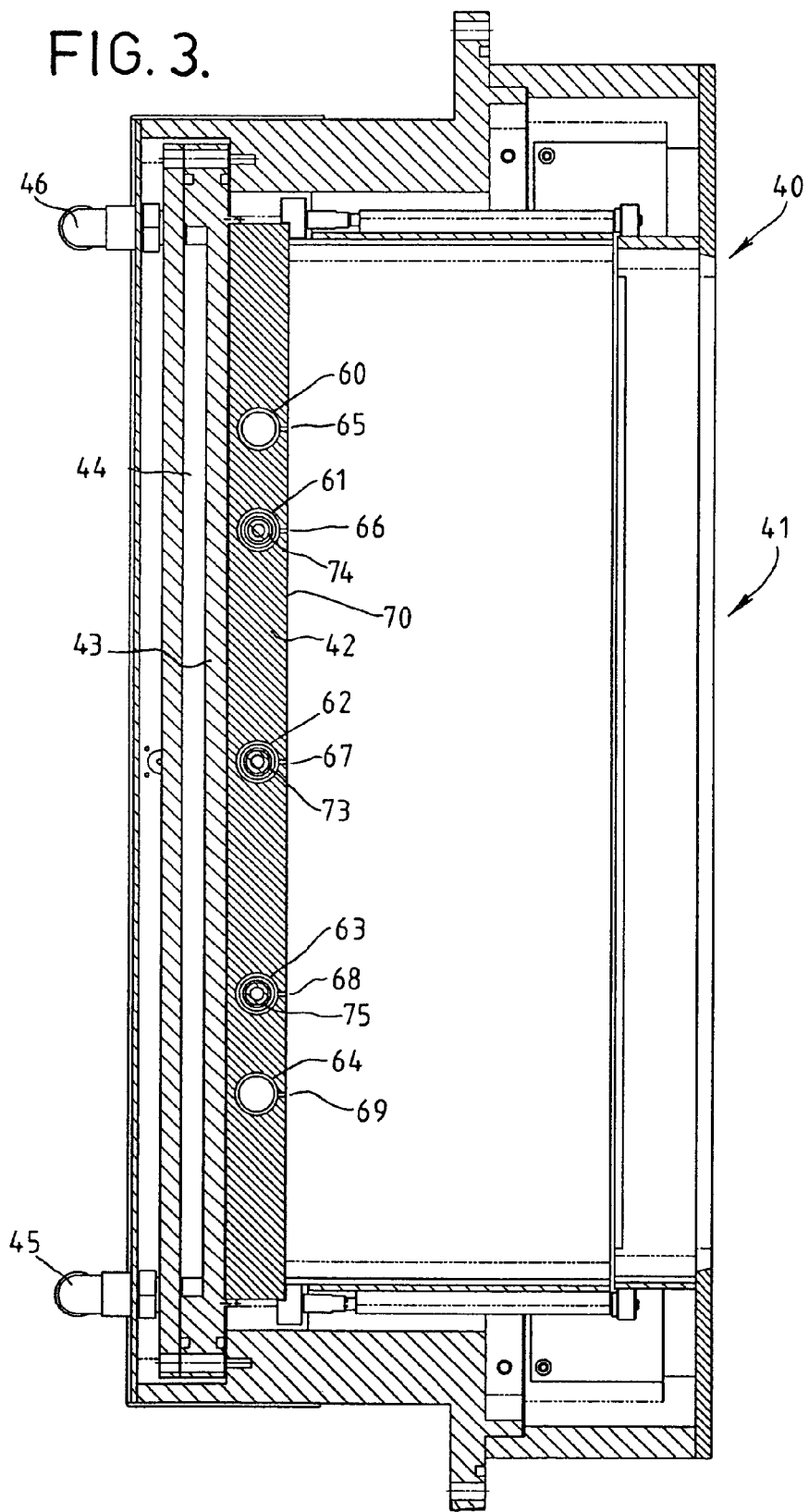
FIG. 3 is an enlarged sectional plan view of the beam stop.

Beam stop 23 is illustrated schematically in FIG. 2 and more details of the design of the beam stop can be seen from FIGS. 3 and 4. Corresponding components of the beam stop which are illustrated in FIGS. 2, 3 and 4 are given the same reference numerals.

As illustrated, the beam stop comprises a Faraday cup 40 having a beam aperture 41 which is wide enough in the direction of scanning 27 of the scanned beam to receive the beam into the Faraday cup over the entire range of scan of the beam. On the other hand, the aperture 41 of the Faraday cup 40 of the beam stop is dimensioned, transversely of the beam scanning direction, so as to be sufficient only to receive the full beam diameter. Thus, FIG. 3 shows the beam stop in a section taken in the plane of scanning of the beam, illustrating the large dimension of the aperture 41, and FIG. 4 is a section of the beam stop in a plane perpendicular to the scanning plane of the beam, showing the smaller dimension of the aperture 41.

A beam stop plate 42 is located at the rear of the Faraday cup 40 so as to face the aperture 41. The beam stop plate is typically made of graphite and is electrically insulated from the casing of the Faraday cup. The plate 42 extends in the Faraday cup over the full scan of the scanned ion beam, so that beam ions entering the Faraday cup impinge on the beam stop plate 42.

The beam stop plate 42 is mounted on a water cooled backing plate 43 provided with cooling channels 44, through which cooling water may be supplied through connections 45 and 46.

Although the beam stop plate 42 may be in direct contact with the water cooled backing plate 43, the combined structure is electrically insulated. Beam current absorbed by the beam stop plate 42 can therefore be monitored via an electrical connection 50 which is shown schematically in FIG. 2.

The interior of the Faraday cup 41 of the beam stop 40 is provided with liners 51 and 52. The inner liner 51, nearer to the beam stop plate 42, may be electrically connected to the beam stop plate, whereas the outer liner 52, adjacent the aperture 41, is insulated from the inner liner 51, and may itself be connected to the casing of the beam stop. As can be seen in FIGS. 4 and 5, the inner liner 51 extends a predetermined distance in the beam direction in front of the beam stop plate 42, in order to absorb secondary electrons and other charged particles which may be emitted from the beam stop plate 42 as a result of bombardment by the beam ions.

Permanent magnets 53 and 54 are located on opposite sides of the narrow dimension of the Faraday cup 40, so as to provide a magnetic field across the aperture 41 of the Faraday cup with field lines extending substantially parallel to the plane of the paper of FIG. 4, and fully over the larger dimension of the aperture 41. This magnetic field is effective to prevent relatively slower moving charged particles, such as emitted by the beam stop 42, from escaping the Faraday cup, and in particular ensures that these particles are absorbed either back on the beam stop plate 42 or by the inner liner 51 which is electrically connected to the beam stop plate 42. The magnetic field also prevents external electrons from entering the Faraday cup and such external electrons which are deflected by the field to impact the walls of the Faraday cup do so on the outer liner 52. In this way, the Faraday cup serves accurately to monitor the amount of beam current entering the Faraday cup at any time.

A beam stop of this general kind will be known to those skilled in this art. Such beam stops are typically used for monitoring the beam current of ion implanters when the ion beam is not being used for implanting, so that the intended target is located clear of the beam. In the present case, of course, the beam stop is dimensioned so as to receive a scanned beam.

The beam stop plate 42 illustrated in FIGS. 2, 3 and 4 includes five bores 60 to 64, machined into an edge of the beam stop plate 42 and extending in directions perpendicular to the larger dimension of the beam stop plate, substantially the whole way across the smaller dimension of the plate. The bores 60 to 64 have diameters which are less than the thickness of the beam stop plate 42.

Narrow slits 65 to 69 are provided in the front face 70 of the beam stop plate 42 communicating with the interior of the respective bores 60 to 64. As illustrated, the slits 65 to 69 are aligned with the axes of the bores 60 to 64 and extend across the smaller dimension of the beam stop plate 42 a sufficient distance to encompass the greater part of any ion beam entering the Faraday cup 40 and impinging upon the plate 42. However, the length of the slits 65 to 69 across the smaller dimension of the beam stop plate is not critical.

A beam current collecting rod 73 is mounted in the bore 62 located at the center of the beam stop plate 42. Similar beam current collecting rods 74 and 75 are mounted co-axially in the inner pair of bores 61 and 63 on either side of the central bore 62. The outer two bores 60 and 64 are not used in this embodiment which is designed for use with 200 mm wafers. If the implanter is modified for 300 mm wafers, the rods 74 and 75 are mounted in the outer bores 60 and 64 and the inner bores 61 and 63 are not used.

As best seen in FIG. 4, each of the current collecting rods 73, 74 and 75 is formed of a cylindrical graphite liner 76, supported on a steel rod 77, by means of a recessed fastening bolt 78. The bolt 78 is screwed into a lower free end of the rod 77 (as illustrated in FIG. 4) and the upper end of the rod 77 extends as an electrical vacuum feedthrough 79, to provide a connection point 80 to the rod 73 which is protected by a cover 81.

Each of the rods 73, 74 and 75 is electrically insulated from the beam stop plate 42 so that separate electrical connection can be made to the rods by the respective connection point 80. These connections are illustrated schematically in FIG. 2 by lines 81, 82 and 83.

In operation, it can be seen that as the beam is scanned across each of the slits 66, 67 and 68, some beam ions will pass through the slit and impinge on the respective current collecting rod contained within the bore inside the beam stop plate. Charge thereby collected on the respective rod can flow along the respective electrical connection 81, 82 and 83 for monitoring. In practice, as the beam scans over a slit, a pulse of current can be detected in the respective connection 81, 82 or 83. These pulses can be used as timing pulses.

It should be understood that the beam current collecting arrangement represented by one of the current collecting rods with its associated slit is not suppressed in the sense of ensuring all beam ions passing through the slit will provide a corresponding unit of charge flowing along the respective connection 81, 82 or 83. Nevertheless, a current pulse will be produced on the respective connection as the beam passes the respective slit and this current pulse can be used for timing purposes.

As shown in FIG. 2, the connections 81, 82 and 83 from the respective current collecting rods in the beam stop plate 42 are supplied to a controller 90, which also receives the connection from the beam stop plate 42 itself along the line 50. In the controller 90, the currents on lines 50, 81, 82 and 83 are summed to provide a true figure for the total beam current being dumped in the beam stop at any time. The timing of the current pulses on lines 81, 82 and 83 are also used for setting up and confirming the alignment, centering and parallelism of the scanned beam as will now be described in detail.

There is a requirement with a scanned beam single wafer type implanter as described herein, to ensure that the scanned beam is correctly centered, especially in the scanning plane, on the center line of the implant chamber, that the scanned beam is aligned correctly in the chamber relative to the desired beam path through the chamber, and that the scanned beam remains parallel to the desired beam path over the range of scanning. These requirements are necessary to ensure that the scanned beam covers the entire surface of the wafer being implanted correctly, and also correctly traverses on each scan a Faraday which may be located to one side of the wafer during implantation, so that the rate of delivery of dopant ions to the wafer can be monitored during an implant run.

During implantation of a wafer such as wafer 19 on the holder 20, the travelling Faraday 24 is positioned to one side of the position of the wafer holder 20 as shown in dotted outline at 95 in Figure 2. Then, as the beam 26 is scanned to and fro in the direction of arrow 27, the beam will traverse to and fro across the travelling Faraday 95 at one end of each beam scan. As the beam traverses the Faraday 95, an amount of charge is delivered to the travelling Faraday 24 by beam ions passing through the slit 96 in the front plate of the Faraday, with this amount of charge providing, in relation to the speed of scan of the beam 26, a measure of the unit of dose being delivered to an area of the wafer, corresponding to the width of the slit 96, on each scanning pass of the beam over the wafer. Provision may then be made, as is known in the art, to adjust the process parameters of the implanter to ensure an even delivery of dopant dose over the whole wafer, and also to ensure that the correct dose is delivered to all regions of the wafer by the end of the implant run.

Errors in the dosage delivered to the wafer may arise if the beam 26 does not remain accurately parallel to the desired beam direction as it is scanned to and fro. Furthermore, if the beam 26 does not remain aligned precisely to the desired beam direction, ions may be implanted into the wafer at an incorrect angle.

In FIG. 2, the desired center line of the implant chamber is indicated at 97, and it can be seen that the central current collecting rod 73 and associated slit 67 in the beam stop plate 42 of the beam stop 23 is aligned on this center line 97. It can be seen also that the upper and lower current collecting rods 74 and 75 have their associated slits 66 and 68 located symmetrically at equal distances on opposite sides of the line 97.

As mentioned previously, it is important that the implanter is set up so that a) the beam 26 of ions is scanned symmetrically on either side of the center line 97, i.e. the scanned beam is effectively centered, b) that the beam 26 is accurately aligned with the center line 97, and c) that as the beam 26 is scanned it remains accurately parallel to the center line 97, i.e. beam parallelism is maintained during scanning. The beam stop 23 can be used in association with the travelling Faraday 24, during set up of the implanter, to confirm or enable adjustment to provide the above beam centering, alignment and parallelism.

FIG. 5 is a timing diagram illustrating the timing of pulses from the current collecting rods 73, 74 and 75, in relation to the scanning waveform of the beam; together with the timing of pulses of current received by the travelling Faraday 24 in various positions of the Faraday across the scanned beam.

The upper trace 100 in FIG. 5 represents the scanning waveform of the ion beam 26. As illustrated the beam is scanned to and fro in accordance with a symmetrical triangular waveform, so that the speed of transverse scanning of the beam 26 in the direction of arrows 27 is always substantially constant, and the turnaround time at each end of scan is minimised. It should be appreciated that this triangular scanning waveform can typically be used at least during setting up of the ion beam scanner 14 and collimator 16, even if, once set up, the triangular waveform is somewhat modified during actual implantation.

Trace 101 in FIG. 5 represents the timing of the current pulses from the central rod 73 with its associated slit 67 in the beam stop plate 42 of the beam stop 23. Assuming the scanning waveform 100 is indeed a symmetrical triangular waveform, the current pulses from the central timing slit 67 have alternating constant time periods $t_1$ and $t_1'$. If the scanned beam is centered so as to extend symmetrically on either side of the slit 67, then $$t_1 = t_1'.$$

Accordingly, to confirm proper centering of the scanned beam, the controller 90 receiving the current pulses from the central current collecting rods 73 on line 81, is arranged to monitor the time spacing of successive pulses on line 81, and to provide a signal on a line 110 from the controller representing the value of $t_1 - t_1'$.

Referring again to the timing diagram of FIG. 5, the trace 102 represents the timing of current pulses from the current collecting rod 74 with its associated timing slit 66, and the trace 103 represents the timing of the pulses from the rod 75 with its associated time slit 68. The current pulses on trace 102 have alternating long time spacings $t_2$ and short time spacings $t_3$. Similarly, the pulses of trace 103 have alternating long time spacings $t_2'$ and short time spacings $t_3'$. Since the two timing slits 66 and 68 are arranged symmetrically on either side of the central slit 67, when the scanned beam is correctly centered on the beam stop, $$t_2 = t_2' \text{ and } t_3 = t_3'.$$

It may be noted that $$t_2 + t_3 = t_2' + t_3' = \tau$$

where $\tau$ is the period of the scanning waveform $\tau$.

Accordingly, the timing pulses on lines 82 and 83 may also be used in controller 90 to develop a signal on line 110 for use in controlling the centering of the scanned beam.

In practice, the true center line of the scanned beam may be defined with reference to the beam collimator. Manufacturing tolerances may then have the effect of locating the nominally central slit 67 slightly off the true center line. Correct centering of the beam can still be ensured if the error between the nominal center line defined by the position of slit 67 and the true center line is known.

To check alignment of the scanned beam and also beam parallelism, timing signals must also be derived from the travelling Faraday 24. If the travelling Faraday 24 is located by means of the actuator 31 so as to be precisely on the center line 97 of the implant chamber, the timing signals from the travelling Faraday 24 should then occur at the same point in the scanning waveform as the timing signals from the central current collecting rod 73 and its associated timing slit 67 in the beam stop 23.

In practice, the controller 90 is arranged to control the position of the travelling Faraday 24, by means of signals on a line 112 in association with position feedback signals on a line 113, so that the travelling Faraday 24 is positioned in the process chamber so as not to cast a shadow or to screen the respective timing slit of the beam stop 23, when the timing pulses from that timing slit are being measured.

In one example, the travelling Faraday may be held by the controller 90 completely clear of the beam stop 23, while the timing of the pulses from all three of the current collecting rods 73, 74 and 75 is measured. Then the controller 90 may bring the travelling Faraday 24 into the central position on the center line 97 as illustrated in FIG. 2, and then measure the timing of the current pulses caused by the ion beam scanning across the travelling Faraday in this position. These current pulses are supplied to the controller 90 along a line 114.

The timing of the current pulses from the travelling Faraday 24 when in the central position is illustrated in trace 106 of FIG. 5. In trace 106, these timing pulses are shown occurring at slightly different times, relative to the waveform 100, compared to the timing pulses 101 from the central timing slit of the beam stop. Assuming that the Faraday 24 is correctly on the center line 97, this difference in timing for the current pulses from the travelling Faraday is representative of misalignment of the scanned beam (assuming the nominal center line defined by the beam stop is precisely aligned with the true center line referenced to the collimator). If the scanned beam is correctly aligned with the center line 97, then the pulses represented by trace 106 would be equally spaced with $t_6 = t_6'$. Accordingly, the controller 90 is arranged to monitor the spacing of the pulses and provide a correction signal on a line 115 representing any misalignment of the ion beam.

It may be appreciated that alignment of the ion beam at different positions across the width of the scanned beam could also be measured by positioning the travelling Faraday at a position precisely corresponding to either of slits 66 or 68 in the beam stop, and then ensuring that the timing of pulses from the travelling Faraday in the appropriate position correspond to the timing of the pulses provided by the relevant timing slit of the beam stop. This procedure is in fact used for checking that the scanned beam remains parallel to the center line 97 as the beam is scanned to and fro.

Accordingly the scanning Faraday 24 is subsequently positioned firstly at a position corresponding to the upper timing slit 66 of the beam stop and the timing pulses from the Faraday 24 are then measured. Then the travelling Faraday 24 is positioned at a location corresponding to the lower timing slot 68 of the beam stop 23 and further timing pulses are measured. The timing pulses for the upper position are represented in FIG. 5 by trace 105, and those for the lower position are represented by the trace 104. If the beam is correctly parallel and aligned, then the time spacings $t_4$ and $t_5$ (trace 105) of the current pulses from the travelling Faraday when in the upper position, should be the same as the time spacings $t_2$ and $t_3$ for the upper timing slit 66 of the beam stop 23. Similarly, if the scanned beam is correctly aligned and parallel, the timing of the pulses from the travelling Faraday when in the lower position, $t_4'$ and $t_5'$ (trace 104) should correspond to the timing of the pulses of the lower timing slit 68 from the beam stop ($t_2'$ and $t_3'$).

Accordingly, the controller 90 is arranged to measure the timing of the current pulses from the travelling Faraday 24 in each of the upper and lower positions, to compare these timings with the previously obtained timings from the timing slits of the beam stop, and then provide a signal on line 116 for indicating any lack of parallelism in the scanned beam.

The control signals on lines 110 and 115 from the controller 90 are supplied to the scanner and collimator controller 111 and are used to adjust the drive signal on line 117 to the scanner 14 and the drive signal on line 118 to the collimator 16. Those skilled in the art will be familiar with the modifications to the scan drive and collimator drive on lines 117 and 118 which may be required to correct for misalignment of the beam, and to ensure proper beam centering in response to the control signals from the controller 90.

A timing signal on a line 119 is supplied by the scanner and collimator control unit 111 to the controller 90 to provide datum points for monitoring the timing of the current pulses from the beam stop timing slits and from the travelling Faraday. The timing signals on line 119 may for example represent the timing of the turning points of the scanning waveform. However, so long as the beam is scanned in accordance with a symmetrical and triangular waveform and has a constant period and amplitude during a particular measurement procedure of the current pulses from the beam stop and from the travelling Faraday, appropriate correction signals on lines 110, 115 and 116 can be derived by the controller 90 purely from the timing of the various pulse signals, as has been explained above.

Although it is preferred if the timing slits in the beam stop 23 are arranged symmetrically on either side of the datum center line 97, and the travelling Faraday 24 is positioned accurately in alignment with these timing slits when providing corresponding timing pulses to confirm alignment and parallelism, other arrangements are possible. For example, if the two timing slits 66 and 68 of the beam stop 23 are located at different distances ($d_1$ and $d_2$) on opposite sides of a center line 97, the timing of current pulses from these two asymmetric slits can still be used for confirming the centering of the scanned beam on the beam stop. Then, for proper centering of the beam, the following equation must be satisfied:

$$(t_2-t_3)/(t_2'-t_3')=d_1/d_2.$$

Furthermore, if the scanned beam is assumed to be parallel, alignment of the beam can still be confirmed using timing pulses from a single timing slit in the beam stop at a position $d_1$ from the center line, and with timing pulses from the travelling Faraday positioned at a different position $e_1$ from the center line. Then for correct alignment the following equation must be satisfied:

$$(t_2-t_3)/(t_4-t_5)=d_1/e_1,$$

where the time spacing of the pulses from the beam stop slit are represented by $t_2$ and $t_3$, and the time spacing of pulses from the travelling Faraday are represented by the times $t_4$ and $t_5$.

Parallelism of the beam can be confirmed using timing measurements from timing slits in the beam stop at different distances $d_1$ and $d_2$ from the center line, and timing pulses from the travelling Faraday at positions $e_1$ and $e_2$ from the center line. Then for correct parallel scanning, the following equation must be satisfied:

$$(t_2'-t_3)/(t_4'-t_5)=(d_1+d_2)/(e_1+e_2),$$

where the time spacing of the pulses from the beam stop timing slits at positions $d_1$ and $d_2$ are respectively $t_2$, $t_3$ and $t_2'$, $t_3'$ respectively, and the time spacings of the pulses from the travelling Faraday at the positions spaced $e_1$ and $e_2$ from the center line are respectively $t_4$, $t_5$ and $t_4'$, $t_5'$ respectively.

More simply, if the beam can be confirmed as already aligned with the center line and centered at the beam stop, parallelism can be confirmed with just one further timing slit at the beam stop spaced $d_1$ from the center line, and one position of the travelling Faraday 24 spaced $e_1$ from the center line. Then for parallelism the following equation must be satisfied:

$$(t_2-t_3)/(t_4-t_5)=d_1/e_1.$$

Instead of measuring the duration of the intervals between pulses from the various timing slits, it is also possible to measure the pulse timings relative to a datum time, which may for example be the beginning of each scan of the beam. Then, if a full cycle of the beam scan has a known duration of 512 units of time, beam centering can be confirmed when the first pulse from the center timing slit is at time $T1=128$, i.e. half of one half cycle (or one way traverse) of the beam across the beam stop, assuming a triangular scan waveform. Alternatively, using the pulses from timing slits symmetrically arranged on either side of the central slit, $$T2=256-T3,$$

where $T2$ and $T3$ are the times of the pulses from the two slits.

Similar measurements may be taken of the times $T4$, $T5$ and $T6$, where $T4$ is the timing of the pulse from the travelling Faraday when located at the center line, and $T5$ and $T6$ are the timings when located at positions corresponding to the symmetrically disposed slits in the beam stop.

Then for proper alignment, $T1=T4$, and parallelism is calculated from $T1-T4$, $T2-T5$ and $T3-T6$.

It would also be possible to monitor centering, alignment and parallelism, even if the beam is not scanned in accordance with a symmetrical triangular waveform. So long as the shape of the waveform is known, the controller 90 can be programmed to compare the timings of the pulses from the timing slits of the beam stop and the travelling Faraday, with the predetermined scanning waveform of the beam, and calculate therefrom appropriate error signals to be presented on lines 110, 115 and 116.

In the embodiment described above, timing signals corresponding to the scanning of the ion beam are derived from the beam stop using current collecting rods located behind narrow slits formed in the front face of the beam stop plate. Other structures can also be envisaged. For example, if the beam stop plate is in fact itself divided into two electrically insulated parts, with the division line being located, for example, at the center line 97, the current received on one part of the beam stop plate declines quickly as the beam is scanned from that part onto the other part, and the current received from this other part simultaneously increases rapidly. The timing of this transition can be used in the same manner as the timing pulses derived from the current collecting rods of the above described embodiment illustrated in FIGS. 2, 3 and 4. Thus, the beam stop could be formed with four segments having dividing lines at the positions of the slits 66, 67 and 68. Then the waveforms of the various current signals from the beam stop plate segments could be used to provide the desired timing signals for use by the controller 90.

In the embodiment described above and illustrated in the drawings, the beam stop 23 is a Faraday cup. Examples of the invention may incorporate a beam stop which is not intended for capturing all beam current for measurement purposes, but which is intended only for safely absorbing beam energy. Such a beam stop would not be suppressed and would not include the magnets 53 and 54. Also, such a beam stop need not have the cup-shape illustrated in the drawings.

In further embodiments of the invention, a travelling beam detector which is not a suppressed Faraday cup may be employed instead of the travelling Faraday 24. For the purposes of embodiments of this invention, the travelling beam detector need only provide a timing signal in response to passage over the detector of the scanned beam.

What is claimed is:

1. A beam stop for an ion implanter having a beam scanner for scanning the ion beam over a predetermined scan width relative to a substrate to be implanted in at least one scan direction transverse to the beam path, the beam stop comprising a single, charge suppressed Faraday cup, having an opening with a width dimension extending in said scan direction to receive and absorb the beam at all scan positions of the beam over said scan width, and at least one charge collecting member in said Faraday cup providing a surface exposed to receive ions in said beam, said exposed surface extending in said scan direction a distance less than said width dimension of said opening so that said charge collecting member receives beam ions during only a part of the scan of the beam in said one direction.

2. A beam stop as claimed in claim 1, and including a beam stop plate in said Faraday cup extending in said scan direction over said width dimension to receive the beam over said scan width, said charge collecting member being electrically insulated from the beam stop plate.

3. A beam stop as claimed in claim 2, wherein said beam stop plate has a facing surface receiving the beam, and the charge collecting member is mounted behind said surface, said surface having an aperture in front of said charge collecting member defining said exposed surface thereof and permitting beam ions to pass through said surface to impinge on said exposed surface of said collecting member.

4. A beam stop as claimed in claim 3, wherein said beam stop plate is thicker in the beam direction than said collecting member and has a cavity within its thickness behind said aperture in said facing surface, said collecting member being mounted in said cavity.

5. A beam stop as claimed in claim 4, wherein said charge collecting member is a rod and said aperture is a lit, said rod and said slit extending transversely of said scan direction.

6. A beam stop as claimed in claim 1, wherein said beam stop plate is electrically insulated from the Faraday cup.

7. A beam stop as claimed in claim 1 and comprising a plurality of said charge collecting members in said Faraday cup electrically insulated from each other at different locations along said scan direction over said width dimension.

8. A beam stop as claimed in claim 7, wherein three said charge collecting members are distributed symmetrically in said scan direction.

9. An ion implanter comprising:

an ion beam generator;

a beam scanner for scanning the ion beam in at least one scan direction transverse to the beam path;

a process chamber receiving the scanned beam and having a processing station in the path of the scanned beam at which a substrate can be processed; and a beam end station behind said processing station for terminating and absorbing the scanned beam and defining a nominal center line for the scanned beam, said beam end station including at least one fixed beam detector providing a first characteristic timing signal as the beam is scanned over the detector.

10. An ion implanter as claimed in claim 9, further including a centering monitor responsive to the timing of said first characteristic timing signals from said at least one beam detector to provide a centering signal indicative of the centering of said scanned beam relative to said nominal center line.

11. An ion implanter as claimed in claim 10, wherein a plurality of said fixed beam detectors are distributed along said scan direction.

12. An ion implanter as claimed in claim 11, wherein said beam detectors are distributed symmetrically about said nominal center line.

13. An ion implanter as claimed in claim 12, wherein said scanner is operative to scan the ion beam in accordance with a symmetrical triangular waveform, successive characteristic timing signals from each of any pair of symmetrically opposed said fixed beam detectors having respective first and second alternating uniform time spacings, and said centering monitor providing said centering signal as a function of any difference between said first and second time spacings for one of said pair of detectors and said first and second time spacings for the other of said pair.

14. An ion implanter as claimed in claim 10, wherein said one fixed beam detector is located on said nominal center line.

15. An ion implanter as claimed in claim 14, wherein said scanner is operative to scan the ion beam in accordance with a symmetrical triangular waveform, and said centering monitor provides said centering signal as a function of any non-uniformity in the time spacing of the successive characteristic timing signals from said central fixed beam detector.

16. An ion implanter as claimed in claim 10, wherein said scanner is operative to scan the ion beam in accordance with a predetermined waveform so that at any time the distance in said one direction of the scanned beam from an end of scan position at said beam end station is predictable, and said centering monitor providing said centering signal as a function of the timing of said characteristic timing signals from said at least one beam detector relative to the timing of said periodic scan signal.

17. An ion implanter as claimed in claim 10, wherein said scanner is operative to deflect the beam in accordance with a periodic scan signal including an adjustable dc component for centering the scanned beam, and the implanter further includes a controller responsive to said centering signal to adjust said dc component to center said beam.

18. An ion implanter as claimed in claim 9, further comprising:

a collimator in combination with said scanner for maintaining the scanned beam path parallel;

a travelling beam detector located upstream of said beam end station and movable in said one direction, said travelling beam detector providing a second characteristic timing signal as the beam is scanned over said travelling detector;

and an alignment monitor responsive to a function of the timings of said first-mentioned and said second characteristic timing signals to provide a beam alignment signal.

19. An ion implanter as claimed in claim 18, wherein said scanner and collimator combination is operative to deflect the beam in accordance with a periodic scan signal and is adjustable to adjust the path direction of the parallel scanned beam, and the implanter further includes a controller responsive to said alignment signal for controlling the scanner and collimator combination to adjust said path direction towards a required beam path direction.

20. An ion implanter as claimed in claim 19, wherein said travelling beam detector has an actuator responsive to said controller to move said detector to desired positions in said one scan direction, and said controller is operative to measure the timings of said first characteristic timing signal when the travelling beam detector is positioned by said actuator so as not to screen said fixed beam detector, and to measure the timings of said second characteristic timing signal when the travelling beam detector is positioned by the actuator at a predetermined location along said one direction, said predetermined location corresponding to the location of said fixed detector along said one direction, said controller being responsive to said measured timings to adjust said path direction so that corresponding said measured timings are substantially the same.

21. An ion implanter as claimed in claim 20, wherein said scanner is operative to scan the ion beam in accordance with a symmetrical triangular waveform, and said controller is operative to measure the time spacings of said first and second characteristic signals and is responsive to adjust said path direction so that a time spacing of said first characteristic timing signal is substantially the same as a corresponding time spacing of said second characteristic timing signal.

22. An ion implanter comprising:
an ion beam generator;
a scanner and collimator for scanning the ion beam in at least one direction transverse to the beam path and for maintaining the scanned beam path parallel;
a process chamber receiving the parallel scanned beam and having a process station in the path of the scanned beam at which a substrate can be processed;
a beam end station behind said processing station for terminating the scanned beam, said beam end station including at least two fixed beam detectors at respective spaced positions along said one direction, each said beam detector providing a respective first characteristic timing signal as the beam is scanned over the fixed detector;
a travelling beam detector located upstream of said beam end station and movable in said one direction, said travelling beam detector providing a second characteristic timing signal as the beam is scanned over said travelling detector;
and a parallelism monitor responsive to a function of the timings of said first characteristic timing signals and of said second characteristic timing signals at at least two spaced positions of the travelling beam detector along said one direction, to provide a collimation signal indicative of the parallelism of said scanned beam.

23. An ion implanter as claimed in claim 22, wherein said travelling beam detector has an actuator responsive to said controller to move said detector to desired positions in said one direction, and said controller is operative to measure the timings of said first characteristic timing signals when the travelling beam detector is positioned by said actuator so as not to screen the respective fixed beam detectors, and to measure the timings of said second characteristic timing signals when the travelling beam detector is positioned by the actuator at predetermined locations along said one direction corresponding respectively to the locations of said fixed detectors, said parallelism monitor being responsive to said measured timings to provide the collimation signal.

24. A method of monitoring an ion beam for ion implantation comprising generating an ion beam, scanning the beam in at least one direction transverse to the beam path, receiving the scanned beam in a process chamber having a process station in the path of the scanned beam at which a substrate can be processed, terminating and absorbing the scanned beam at a beam end station behind the processing station which defines a nominal center line for the scanned beam, and detecting the beam at a fixed beam detector in the end station to provide a first characteristic timing signal as the beam is scanned over the detector.

25. A method as claimed in claim 24, wherein the timing of said first characteristic timing signal is monitored to indicate the centering of said beam relative to said nominal center line.

26. A method as claimed in claim 24, wherein the scanned beam is collimated to maintain the scanned beam path parallel;
the beam is also detected by a travelling beam detector, located upstream of the beam end station and movable in said one direction, to provide a second characteristic timing signal as the beam is scanned over said travelling detector; and
the timings of said first and second characteristic timing signals are monitored to indicate the alignment of the scanned beam relative to a required beam direction.

27. A method of monitoring an ion beam for ion implantation comprising generating an ion beam; scanning the beam in at least one direction transverse to the beam path and collimating the scanned beam to maintain the scanned beam path parallel;
receiving the parallel scanned beam in a process chamber having a process station in the path of the scanned beam at which a substrate can be processed;
terminating the scanned beam at a beam end station;
detecting the beam at at least two fixed beam detectors in the end station at respective spaced locations along aid one direction to provide from each said fixed detector a respective first characteristic timing signal as the beam is scanned over the respective fixed detector;
further detecting the beam with a travelling beam detector, located upstream of said end station and movable to each of at least two spaced positions along said one direction, to provide a respective second characteristic timing signal as the beam is scanned over the travelling detector at each of said spaced positions; and
monitoring the timings of said first and second characteristic timing signals to indicate the parallelism of the scanned beam.

\* \* \* \* \*